United States Patent [19]
Sung et al.

[11] Patent Number: 5,441,907
[45] Date of Patent: Aug. 15, 1995

[54] PROCESS FOR MANUFACTURING A PLUG-DIODE MASK ROM

[75] Inventors: Hung-Cheng Sung, Kaohsiung, Taiwan; Ling Chen, Sunnyvale, Calif.

[73] Assignee: Taiwan Semiconductor Manufacturing Company, Hsinchu, Taiwan

[21] Appl. No.: 266,505

[22] Filed: Jun. 27, 1994

[51] Int. Cl.$^6$ .......................................... H01L 21/329
[52] U.S. Cl. ...................................... 437/48
[58] Field of Search ............... 437/904, 48; 365/105, 365/72; 257/910, 105

[56] References Cited

U.S. PATENT DOCUMENTS

| | | | |
|---|---|---|---|
| 3,717,852 | 2/1973 | Abbas et al. | 340/173 |
| 4,217,374 | 8/1980 | Ovshinsky et al. | 427/39 |
| 4,219,836 | 8/1980 | McElroy | 357/55 |
| 4,646,266 | 2/1987 | Ovshinsky et al. | 365/105 |
| 4,727,409 | 2/1988 | Conner et al. | 357/59 |
| 4,859,633 | 8/1989 | Bayraktaroglu | 437/211 |
| 5,272,370 | 12/1993 | French | 257/353 |

*Primary Examiner*—George Fourson
*Assistant Examiner*—David E. Graybill
*Attorney, Agent, or Firm*—George O. Saile; Graham S. Jones II

[57] ABSTRACT

A method of manufacture of a Mask ROM on a semiconductor substrate comprises formation of a first plurality of conductor lines in a first array. A dielectric layer is formed upon the device with a matrix of openings therein in line with the first array. The openings expose the surface of the first conductor lines. Semiconductor diodes are formed in the matrix of openings in contact with the first conductor lines. A second plurality of conductor lines are formed on the surface of the dielectric layer in a second array of conductor lines orthogonal to the first plurality of conductor lines in the first array. A second plurality of conductor lines is aligned with the matrix and is in contact with the upper ends of the semiconductor diodes.

10 Claims, 6 Drawing Sheets

PROCESS FOR MANUFACTURING A PLUG-DIODE MASK ROM

BACKGROUND OF THE INVENTION

1. Field of the Invention

This invention relates to Mask ROM memory devices and more particularly to the structure of such devices.

2. Description of Related Art

When the cell size of a Mask ROM is scaled down to smaller dimensions, conventional MOS switches suffer a number of problems, for example, the short channel effect, hot carriers, punch through, etc. These disadvantages constrain the application of MOS switches in further high density memory devices including Mask ROMS.

U.S. Pat. No. 4,219,836 of McElroy for "Contact Programmable Double Level Polysilicon MOS Read Only Memory" shows a method for manufacturing a ROM with use of FET transistors.

U.S. Pat. No. 3,717,852 of Abbas et al for "Electronically Rewritable Read-Only Memory Using Via Connections" show a diode matrix using voltage breakdown attributed to electromigration to write "0" bits in the rewritable ROM.

An additional reference is U.S. Pat. No. 4,951,103 of Esquivel et al for "Fast, Trench Isolated, Planar Flash EEPROMS with Silicided Bitlines".

SUMMARY OF THE INVENTION

An object of this invention is to provide a plug-diode Mask ROM whereby binary data can be stored with-/without plug-diode contact. The advantages of this cell structure are small die size, easy processing, none of the short channel drawbacks of MOS switches.

In accordance with this invention, a method of manufacture of a Mask ROM on a semiconductor substrate comprises
- formation of a first plurality of conductor lines in a first array,
- formation of a dielectric layer upon the device with a matrix of openings therein in line with the first array, the openings exposing the surface of the first conductor lines,
- formation of semiconductor diodes in the matrix of openings in contact with the first conductor lines,
- formation of a second plurality of conductor lines on the surface of the dielectric layer in a second array of conductor lines orthogonal to the first plurality of conductor lines in the first array, the second plurality of conductor lines being aligned with the matrix, with the second plurality of conductor lines being in contact with the upper ends of the semiconductor diodes.

Preferably, the first array of conductor lines are composed of a material selected from polysilicon and polycide.

Preferably, the dielectric layer is formed, a mask is formed and the matrix of openings are etched in the planarization material.

Preferably, the semiconductor diodes are formed from an initial deposition of a silicon plug material into the matrix of openings.

Preferably, the silicon plug material is selected from amorphous silicon and polysilicon.

Preferably, the silicon plug material is etched back after deposition.

Preferably, phosphorous ions are ion implanted into the silicon material after etching back followed by recrystallization; followed by ion implanting boron containing material into the silicon material.

Preferably, annealing follows ion implanting the boron containing material to complete production of the diodes in the matrix of openings.

Preferably, the second plurality of conductor lines comprise metal conductors in contact with the upper ends of the diodes.

In accordance with another aspect of this invention a Mask ROM on a semiconductor substrate comprises
- a first plurality of conductor lines in a first array,
- a dielectric layer upon the device with a matrix of openings therein in line with the first array, the openings exposing the surface of the first conductor lines,
- semiconductor diodes in the matrix of openings in contact with the first conductor lines, and
- a second plurality of conductor lines on the surface of the dielectric layer in a second array of conductor lines orthogonal to the first plurality of conductor lines in the first array, the second plurality of conductor lines being aligned with the matrix, with the second plurality of conductor lines being in contact with the upper ends of the semiconductor diodes.

Preferably, the first array of conductor lines are composed of a material selected from polysilicon and polycide.

Preferably, the matrix of openings comprise openings etched in the dielectric layer.

Preferably, the semiconductor diodes were formed from an initial deposition of a silicon plug material into the matrix of openings.

Preferably, the silicon plug material is selected from amorphous silicon and polysilicon.

Preferably, the silicon plug material having an etched back surface formed after deposition.

Preferably, phosphorous ions were ion implanted into the silicon material; and boron containing material ion was implanted into the silicon material above the phosphorous material.

Preferably, the device was annealed following ion implanting the boron containing material to complete production of the diodes in the matrix of openings.

Preferably, the second plurality of conductor lines comprise metal conductors in contact with the upper ends of the diodes.

BRIEF DESCRIPTION OF THE DRAWINGS

The foregoing and other aspects and advantages of this invention are explained and described below with reference to the accompanying drawings, in which:

FIG. 10 is a section taken along line 1—1 in FIG. 2 and 10—10 in FIG. 11.

DESCRIPTION OF THE PREFERRED EMBODIMENT

Figure 1:
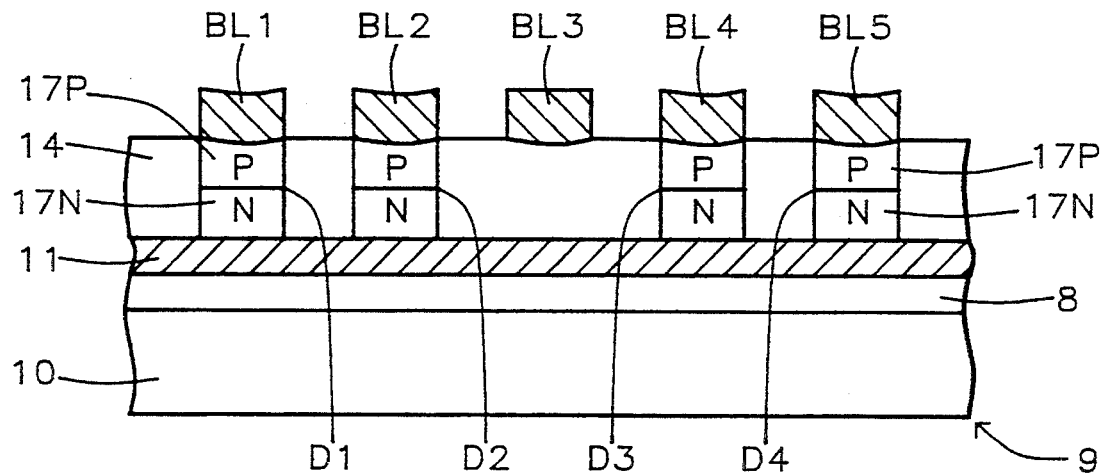
FIG. 1 shows a sectional view taken along line 1—1 in FIG. 2 of a fragment of a plug-diode mask ROM device in accordance with this invention.
Figure 2:
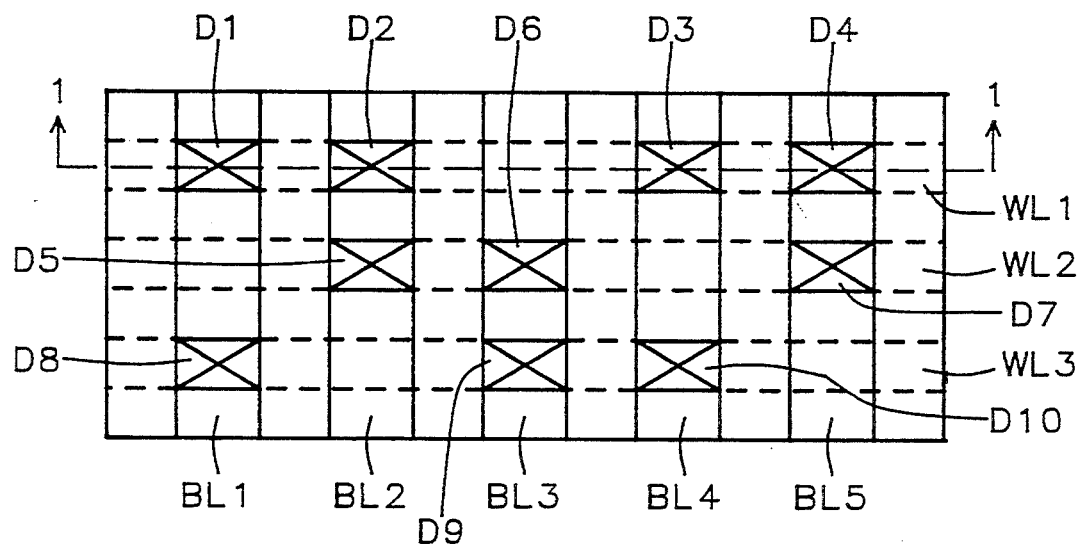
FIG. 2 shows a plan view of the device shown in FIG. 1.

FIG. 1 shows a sectional view taken along line 1—1 in FIG. 2 of a fragment of a plug-diode mask ROM device 9 in accordance with this invention. FIG. 2 shows a plan view of the device shown in FIG. 1. Device 9 is formed on a silicon semiconductor substrate 10 having a field oxide layer 8 grown upon its surface. Upon field oxide layer 8, a set of transverse word lines 11 (WL1, WL2, WL3, and WL4) have been formed. Over the word lines 11 and the substrate 10 is formed a planarization material 14 with openings therethrough in which a number of PN semiconductor diodes D1, D2, D3, D4, D5, D6, D7, D8, D9, D10, D11 and D12 have been formed. Across the surface of the device 9 are a plurality of bit lines BL1, BL2, BL3, BL4, and BL5.

Figure 3:
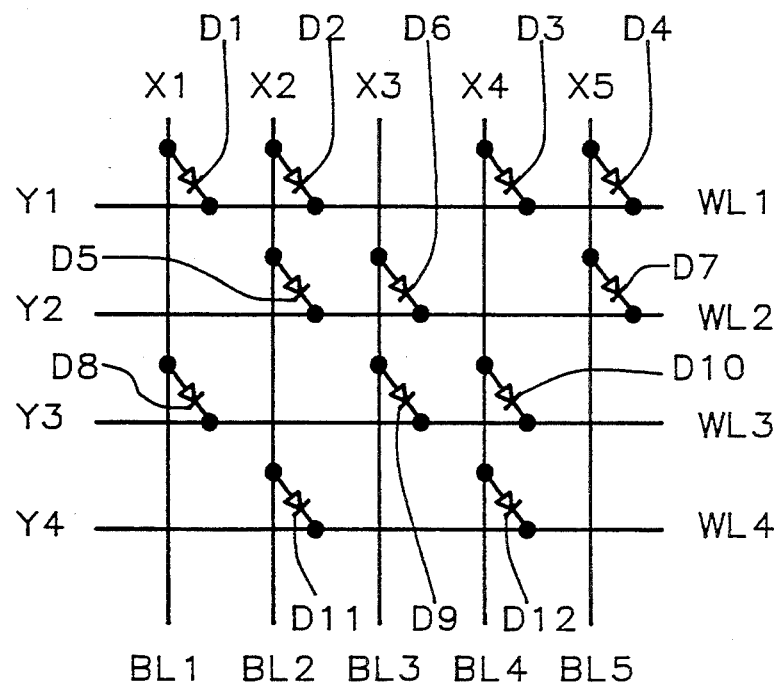
FIG. 3 is an electrical schematic equivalent circuit of the device of FIGS. 1 and 2.

FIG. 3 is an electrical schematic equivalent circuit of the device of FIGS. 1 and 2 with an x, y grid arrangement of bit lines x1, x2, ... x5 (BL1, BL2, ... BL5) and word lines y1, y2, y3, y4 (WL1, WL2, WL3, and WL4) connected by means of the PN diodes D1, D2, D3, D4, D5, D6, D7, D8, D9, D10, D11 and D12. The PN diodes D1 ... D12, etc. connect from the bit lines down to the word lines as indicated in Table I below.

TABLE I

|     | BL1 | BL2 | BL3 | BL4 | BL5 |
| --- | --- | --- | --- | --- | --- |
| WL1 | D1  | D2  |     | D3  | D4  |
| WL2 |     | D5  | D6  |     | D7  |
| WL3 | D8  |     | D9  | D10 |     |
| WL4 |     | D11 |     | D12 |     |

Process of Manufacture of Diode-Plug Mask ROM

Figure 4:
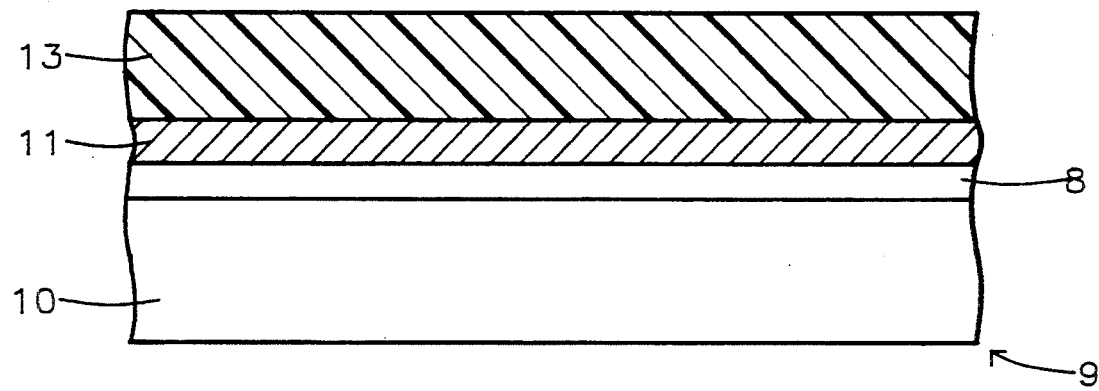
FIG. 4 is a sectional view taken along line 1—1 in FIG. 2 of the device of FIGS. 1 and 2 in an early stage of manufacture.

FIG. 4 is a sectional view taken along line 1—1 in FIG. 2 of the device of FIGS. 1 and 2 in an early stage of manufacture. Device 9 is formed on a silicon semiconductor substrate 10 upon which a set of polycrystalline silicon transverse word lines 11 (WL1, WL2, WL3, and WL4) have been formed. The word lines 11 are composed of polysilicon or polycide. Polycides are a combination of polysilicon and silicides. A typical polycide has a lower level of polysilicon with and an upper level of silicide. The polycide is selected from the group consisting of $WSi_2$, $TiSi_2$, $CoSi_2$, $MoSi_2$, and $TaSi_2$. If polysilicon is used, the polysilicon is preferably formed by thermal reduction of $SiHCl_3$ in hydrogen or by thermal decomposition of silane $SiH_4$ in a reactor between about 600° C. and 650° C. at 0.2 to 1.0 Torr using 100% silane or a diluted mixture of 20–30% silane in nitrogen at about the same pressure, as described in Sze, Semiconductor Devices Physics and Technology, John Wiley & Sons, pages 362–363 (1985).

Next a word line photoresist mask 13 has been formed by depositing photoresist and patterning the mask by exposure photolithographically. Then the word line layer 11 is patterned by etching through the mask 13.

Figure 5:
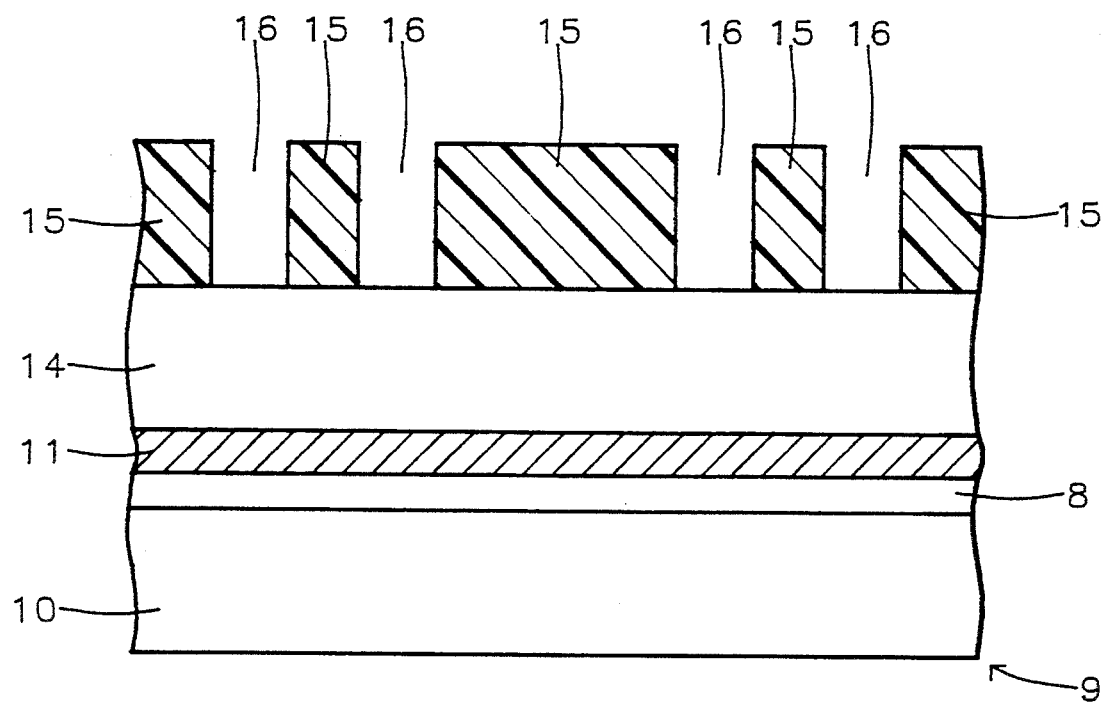
FIG. 5 shows the device of FIG. 4 after the mask has been removed and a planarization layer has been applied to the device.

FIG. 5 shows the device of FIG. 4 after the mask 13 has been removed and a planarization layer 14 composed of BPSG (Borophosphosilicate glass) having a thickness of about 6000Å has been applied to the device by means of PECVD (Plasma Enhanced Chemical Vapor Deposition) process. Next, a cell contact mask 15 used to form a ROM code has been formed by depositing photoresist and patterning the mask by exposure photolithographically, with the contact holes 16 therein.

Figure 6:
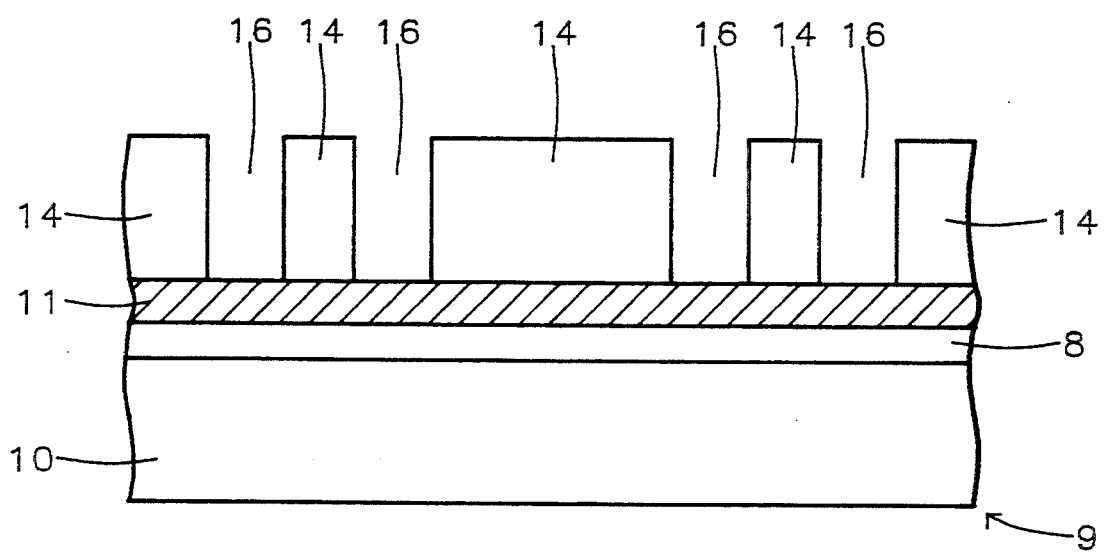
FIG. 6 shows the device of FIG. 5 after the mask has been used to etch contact holes in the planarization layer providing the contact holes for a ROM code.

FIG. 6 shows the device of FIG. 5 after the mask 15 has been used to etch contact holes 16 in planarization layer 14 providing the contact holes 16 for a ROM code.

Etching

The vertical contact holes 16 are etched with minimal lateral etching by dry etching in $CF_4$ and $CHF_3$ gas at a temperature of about 0° C. in a plasma etching chamber. A wet chemical etch is not recommended as an alternative, since it would result in serious lateral etching.

Figure 7:
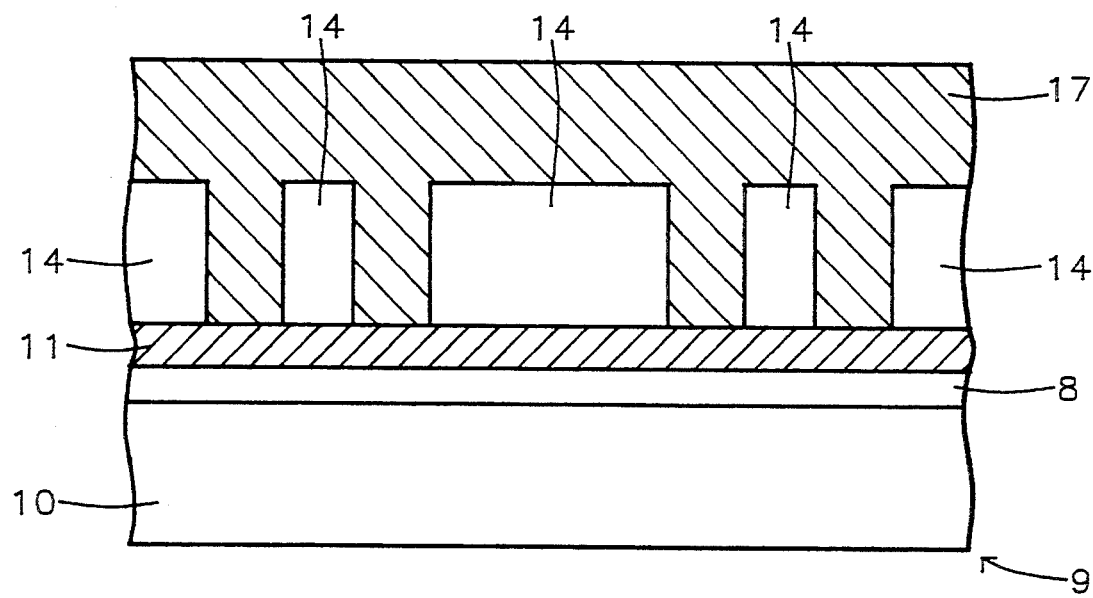
FIG. 7 shows the device of FIG. 6 after a blanket deposition of a layer for forming polysilicon or amorphous silicon plugs shown in FIG. 8.
Figure 8:
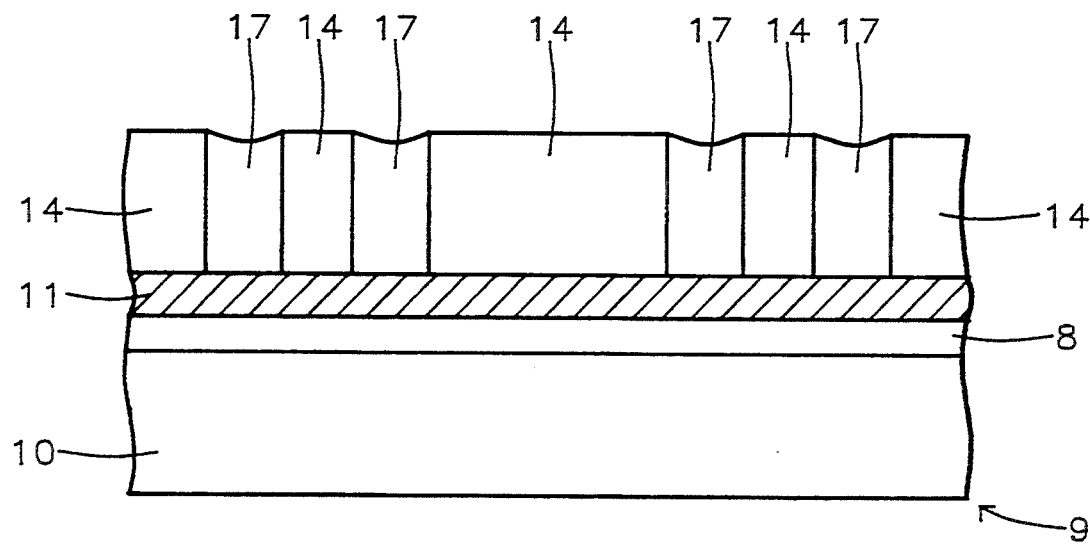
FIG. 8 shows the device of FIG. 7 after an etch-back step of etching away the polysilicon or amorphous silicon (α-Si) layer down to the level of the planarization layer leaving polysilicon plugs or amorphous silicon (α-Si) plugs.

FIG. 7 shows the device of FIG. 6 after a blanket deposition of layer 17 (for forming plugs 17 shown in FIG. 8.) Layer 17 is composed either of amorphous silicon (α-Si) or polysilicon which fills the contact holes 16 and provides blanket coverage of planarization layer 14. In the case of polysilicon, layer 17 is preferably deposited by thermal reduction of $SiHCl_3$ in hydrogen or by thermal decomposition of silane $SiH_4$ in a reactor between about 600° C. and 650° C. at 0.2 to 1.0 Torr using 100% silane or a diluted mixture of 20–30% silane in nitrogen at about the same pressure, as described in Sze, Semiconductor Devices Physics and Technology, John Wiley & Sons, pages 362–363 (1985). The CVD deposit is deposited in a process reactor to a thickness of 6,000Å by CVD (chemical vapor deposition).

For CVD deposition of α-Si the gas used is $Si_2H_6$ at a temperature of from 480° C. to 560° C., a pressure of 0.2 Torr to 0.3 Torr at a flow rate of 60 sccm to 100 sccm at a deposition rate of 10 nm/min to 20 nm/min.

For CVD deposition of polysilicon the gas used is $SiH_4$ at a temperature of from 590° C. to 630° C., a pressure of 0.2 Torr to 0.3 Torr at a flow rate of 250 sccm to 300 sccm at a deposition rate of 10Å/min to 20Å/min.

Etch-Back

FIG. 8 shows the device of FIG. 7 after an etch-back step of etching away the layer 17 down to the level of planarization layer 14 with slight etching away of the top of the layer in contact holes leaving polysilicon plugs 17 or amorphous silicon (α-Si) plugs 17. The process employed to etch back the layer 17 is plasma etching using $SF_6/O_2$ gas to etch the silicon.

Formation of Diodes

Figure 9:
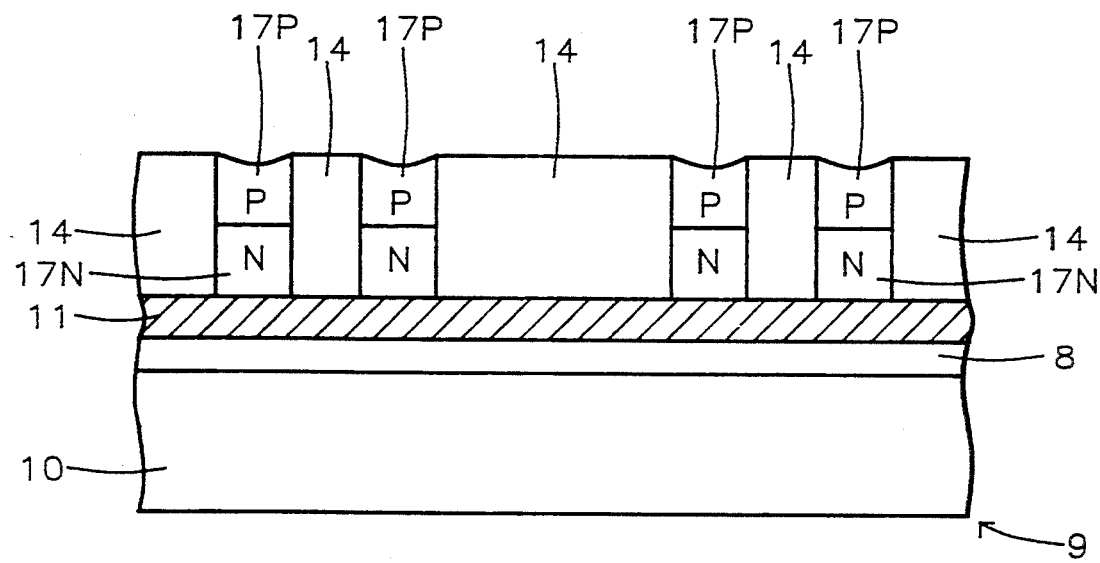
FIG. 9 shows the device of FIG. 8 after multiple steps of treatment of the plugs including phosphorous implantation, recrystallization, boron implantation and annealing.

FIG. 9 shows the device of FIG. 8 after multiple steps of treatment of the plugs 17 including phosphorous implantation, recrystallization, boron implantation and annealing.

1. Phosphorous implantation

First an ion implant 17N of phosphorous negative (N) ions is applied into silicon plugs 17 to form the N ions of the diodes D1 ... D12. The dopant 17N is applied with a dose of from about $1 \times 10E13$ cm$^{-2}$ to about $5 \times 10E13$ cm$^{-2}$, at an energy of from about 80 keV to about 120 keV.

2. Recrystallization

If the plug diode material 17N/17P is amorphous silicon ($\alpha$-Si) or polysilicon in the contact holes 16, then after the phosphorous implantation step, it is preferred that there should be a recrystallization step to produce crystal grain sizes which are required for semiconductor diodes. In other words, the purpose of this step is to produce grain growth in the amorphous silicon ($\alpha$-Si) material. In fact this process is also appropriate for polysilicon material 17N/17P where it is comprises very small grain polysilicon. The recrystallization is achieved by heating in an enclosed oven chamber to a temperature of about 600° C. for a time of about 10 hours in a nitrogen (N$_2$) gas atmosphere. Whereas the initial grain size ranges from 50Å to 100Å; after the recrystallization grain size ranges from 500Å to 5000Å.

3. Boron implantation

Next, an ion implant 17P of boron positive (P) ions is implanted into the silicon plugs 17. The dopant 17P is applied with a dose of between about $3 \times 10E15$ cm$^{-2}$ to about $5 \times 10E15$ cm$^{-2}$, at an energy of from about 20 keV to about 30 keV.

4. Annealing

The device is annealed to repair the damage done by the implantation process including repairing broken lattice bonds in the silicon plugs 17P/17N. The annealing is done at a temperature from about 850° C. to about 900° C. for about one hour.

Figure 10:
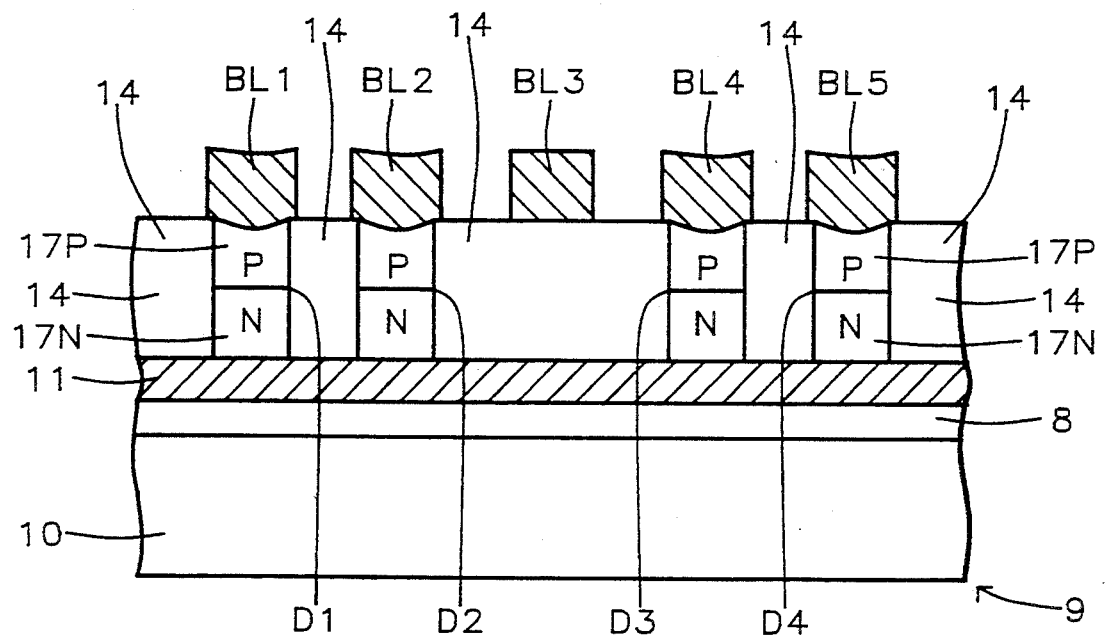
FIG. 10 shows the device of FIG. 9 after blanket deposition of metal which has been formed into bit lines.

FIG. 10 shows the device of FIG. 9 after blanket deposition of metal which has been formed into bit lines BL1-BL5, etc. Note that FIG. 10 is a section taken along line 1—1 in FIG. 2 and 10—10 in FIG. 11. The metal of bit lines BL1-BL5 has been covered with photoresist which has been photolithographically patterned and developed to form a mask. Then the metal of bit lines BL1-BL5 have been etched in accordance with conventional techniques through the mask to produce the bit lines BL1-BL5, etc.

Figure 11:
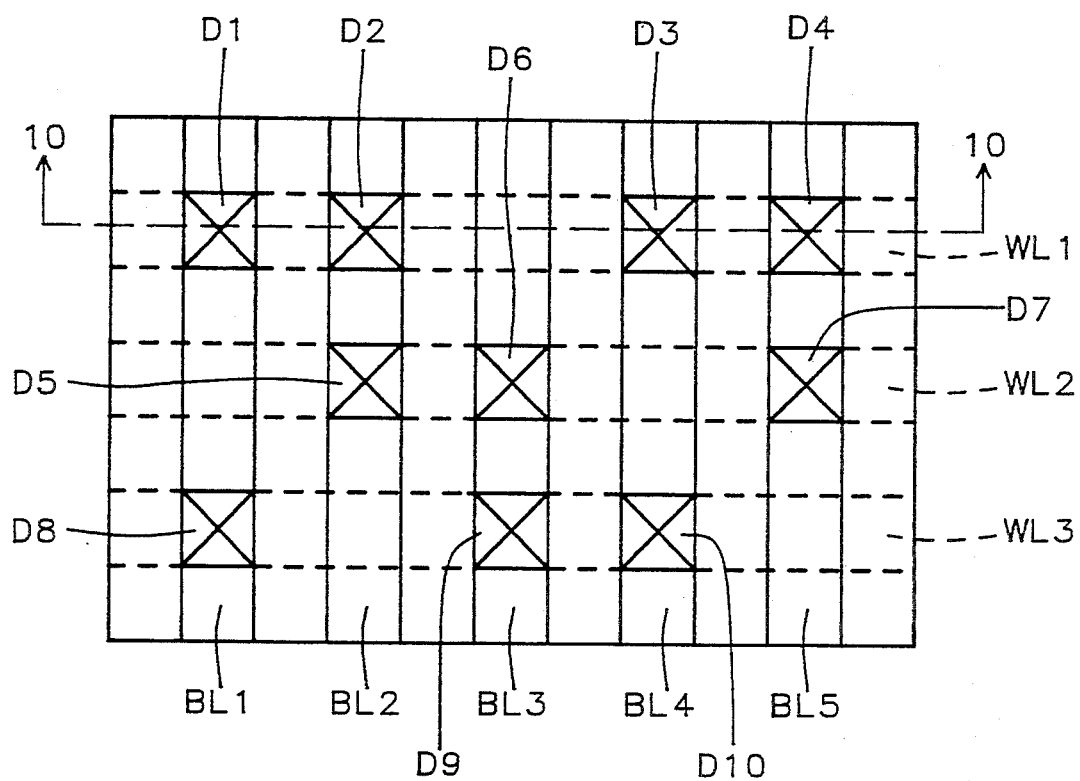
FIG. 11 shows a plan view of the device of FIG. 10, which is similar to FIG. 2, but enlarged for the purpose of better illustrating the interrelationships between the bit lines, the word lines WL1–WL3, and diodes formed in the plugs.

FIG. 11 shows a plan view of the device of FIG. 10, which is similar to FIG. 2, but enlarged for the purpose of better illustrating the interrelationships between the bit lines BL1-BL5, the word lines WL1-WL3, and the diodes D1-D10 formed in the plugs 17P/17N.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacture of a Mask ROM on a semiconductor substrate comprising,
   formation of a first plurality of conductor lines in a first array,
   formation of a dielectric layer upon said substrate with a matrix of openings therein in line with said first array, said openings exposing the surface of said first conductor lines,
   formation of semiconductor diodes in said matrix of openings in contact with said first conductor lines,
   formation of a second plurality of conductor lines on the surface of said dielectric layer in a second array of conductor lines orthogonal to said first plurality of conductor lines in said first array,
   said second plurality of conductor lines being aligned with said matrix, and
   said second plurality of conductor lines being in contact with the upper ends of said semiconductor diodes.

2. A method in accordance with claim 1 wherein said first array of conductor lines are composed of a material selected from polysilicon and polycide.

3. A method in accordance with claim 1 wherein said dielectric layer is formed, a mask is formed and said matrix of openings are etched in said dielectric layer.

4. A method in accordance with claim 1 wherein said semiconductor diodes are formed from an initial deposition of a silicon plug material into said matrix of openings.

5. A method in accordance with claim 4 wherein said silicon plug material is selected from amorphous silicon and polysilicon.

6. A method in accordance with claim 4 wherein said silicon plug material is etched back after deposition.

7. A method in accordance with claim 6 wherein phosphorous ions are ion implanted into said silicon material after said plug material is etched back.

8. A method in accordance with claim 7 wherein boron containing material is ion implanted into said silicon material after phosphorous ions are implanted, and annealing follows ion implanting said boron containing material completing production of said diodes in said matrix of openings.

9. A method in accordance with claim 7 wherein after said phosphorous ions are implanted, following steps comprise
   recrystallization,
   ion implanting of boron containing material into said silicon material and
   annealing to complete production of said diodes in said matrix of openings.

10. A method in accordance with claim 9 wherein said second plurality of conductor lines comprise metal conductors in contact with said upper ends of said diodes.

* * * * *